United States Patent [19]

Wright et al.

[11] 4,090,941

[45] May 23, 1978

[54] CATHODE SPUTTERING APPARATUS

[75] Inventors: Robert Joseph Wright, Tequesta; James Roy Mullaly, Palm Beach Gardens; Ralph Julius Hecht, West Palm Beach, all of Fla.

[73] Assignee: United Technologies Corporation, Hartford, Conn.

[21] Appl. No.: 779,201

[22] Filed: Mar. 18, 1977

[51] Int. Cl.$^2$ ............................................. C23C 15/00
[52] U.S. Cl. .................................................. 204/298
[58] Field of Search .............................. 204/192, 298

[56] References Cited

U.S. PATENT DOCUMENTS

| | | | |
|---|---|---|---|
| 3,354,074 | 11/1967 | Kay ....................................... | 204/298 |
| 3,979,273 | 9/1976 | Panzera et al. ....................... | 204/192 |

OTHER PUBLICATIONS

E. D. McClanahan et al., "Initial work on the Application of Protective Coatings to Marine Gas Turbine Components by High-Rate Sputtering," *ASME Publication*, pp. 1-12, (1974).

*Primary Examiner*—Aaron Weisstuch
*Attorney, Agent, or Firm*—Robert C. Walker

[57] ABSTRACT

Methods and apparatus for depositing a coating material on an underlying substrate are disclosed. Cathode sputtering techniques for rapidly depositing a relatively thick coating on a substrate having a complex geometry are developed. The apparatus employed includes a sputtering chamber formed between a center, post cathode and a hollow, cylindrical cathode. In one embodiment a magnetic field is imposed upon the sputtering chamber to concentrate the sputtered coating material in a preferred region.

9 Claims, 2 Drawing Figures

CATHODE SPUTTERING APPARATUS

BACKGROUND OF THE INVENTION

1. Field of the Invention

This invention relates to the deposition of a coating material on a substrate article, and more particularly to cathode sputtering of high temperature materials.

2. Description of the Prior Art

Cathode sputtering is a process known within the art for depositing surface material on a substrate article. Deposition of the material on the article combines preferred properties of the coating material with the preferred properties of the substrate material to produce a composite structure with enhanced capabilities.

In the practice of the cathode sputtering process, a coating material on a sacrificial cathode is bombarded by minute particles, causing a transfer of energy to the surface atoms of the coating material. The energized surface atoms eject from the sacrificial cathode into a sputtering chamber where a portion of the ejected atoms is intercepted by the substrate to be coated. The intercepted atoms impinge upon the surface of the substrate and become adhered thereto. Sequenced depositions on the atomic scale over a period of time produce an even, well adhered film on the substrate. The deposition of high melting point materials, including even ceramics, has been achieved. Notwithstanding the apparent benefits of cathode sputtering, apparatus and techniques for satisfactorily applying thick, high temperature coatings of material within reasonable elapsed periods have not heretofore been developed.

Designers and manufacturers of gas turbine engines are expending substantial economic and personnel resources in the search for new apparatus and procedures capable of rendering cathode sputtering suitable for the rapid deposition of high temperature coatings on parts having complex geometries.

SUMMARY OF THE INVENTION

A primary object of the present invention is to provide methods and apparatus for coating substrate articles having complex geometries. Apparatus for effecting efficient cathode sputtering is sought, and in at least one embodiment, a specific aim is to deposit a relatively thick, high temperature coating on a multiplicity of substrates within a single apparatus.

According to the present invention the sputtering chamber of a cathode sputtering device is formed between a center, post cathode and a hollow, cylindrical cathode. The center, post cathode and the hollow, cylindrical cathode are simultaneously bombarded with positively charged ions to produce a flux of coating atoms converging from the hollow cathode and a flux of coating atoms diverging from the post cathode.

Primary features of the present invention include the center, post cathode and the hollow, cylindrical cathode which form the sputtering chamber therebetween. An electron emitter at one end of the chamber and an anode plate at the opposing end of the chamber cause a migration of electrons through the chamber during operation. In one embodiment the substrate articles are suspended within the sputtering chamber on a rotatable rod. Other features in more detailed embodiments include means for applying an electrical bias to the substrate article and magnetic means for confining the plasma within the sputtering chamber.

A principal advantage of the apparatus of the present invention is the rapid deposition rate with which the target material is applied to the substrate. Embodiments combining high target surface to chamber volume ratios and magnetic control of the generated plasma enable particularly high deposition rates. The chamber geometry maximizes oblique or side flux and results in high material efficiency rates as errant target atoms impinge upon the opposing cathode and are resputtered into the chamber. An excellent coating quality with good reproducibility is obtained. The coating is both dense and well adhered to the substrate.

The foregoing, and other objects, features and advantages of the present invention will become more apparent in the light of the following detailed description of the preferred embodiment thereof as shown in the accompanying drawing.

DESCRIPTION OF THE PREFERRED EMBODIMENT

Figure 1:
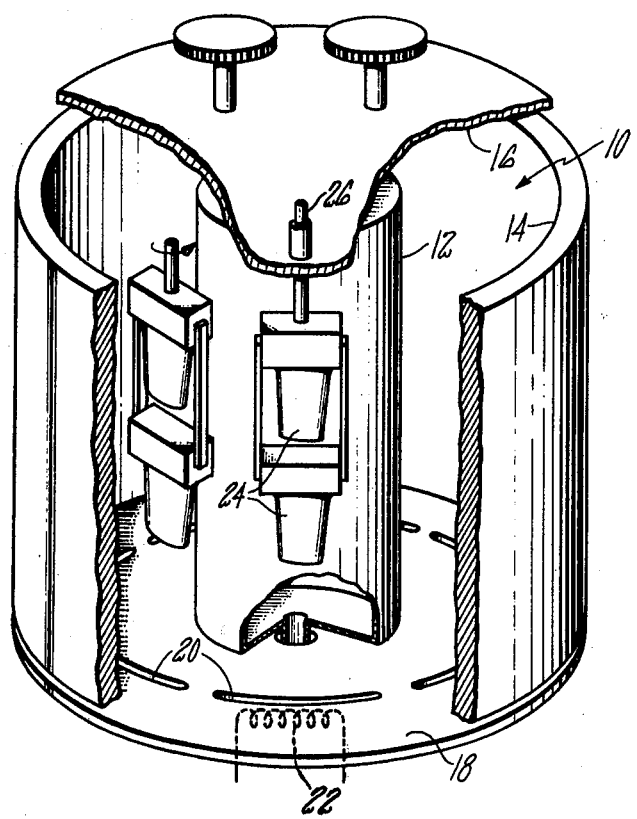
FIG. 1 is a simplified perspective view of the apparatus of the present invention illustrating the principal components forming the sputtering chamber.

The concepts of the present invention are illustrated in the FIG. 1 simplified perspective view of a triode sputtering system. A sputtering chamber 10 is formed between a center, post cathode 12 and a hollow, cylindrical cathode 14. An anode plate 16 is disposed at one end of the chamber 10 and a ground plate 18 having a plurality of apertures 20 is disposed at the opposing end of the chamber. An electron source such as a filament 22 of the type adapted for the thermionic emission of electrons is disposed behind the ground plate. Substrate articles 24 are suspended within the sputtering chamber 10 on a rod-like member 26 which penetrates the anode plate 16. The substrate articles are electrically insulated from the anode plate and the cathodes.

During operation of the apparatus the sputtering chamber is filled with an inert gas such as argon. Electrons emitted by the filament 22 are drawn into the sputtering chamber 10 by the anode plate 16 through the apertures 20 in the ground plate 18. A portion of the emitted electrons strike atoms of the argon gas within the chamber and cause the secondary emission of one or more electrons from the impacted argon atoms. Resultantly, positively charged argon ions are formed. The positively charged ions are electrically drawn to the post cathode and the cylindrical cathode where the ions impart kinetic energy to the surface atoms of the cathode material. Energized cathode atoms sputter from the surface of the cathode into the chamber 10. A converging flux of coating material emanates from the hollow cathode and a diverging flux of coating material emanates from the post cathode. A portion of the sputtered atoms impinge upon and adhere to the substrate article to be coated. The repeated incidence of cathode atoms on the surface of the substrate forms the desired coating thereon. In its basic form the depth of the coating is a function of the exposure period within the chamber and of the intensity of the coating atom flux. Typical coating depths of approximately 5 mils are obtainable in an 8 hour coating cycle. Additional concepts discussed subsequently in this specification reveal techniques for accelerating the rate of deposition.

Figure 2:
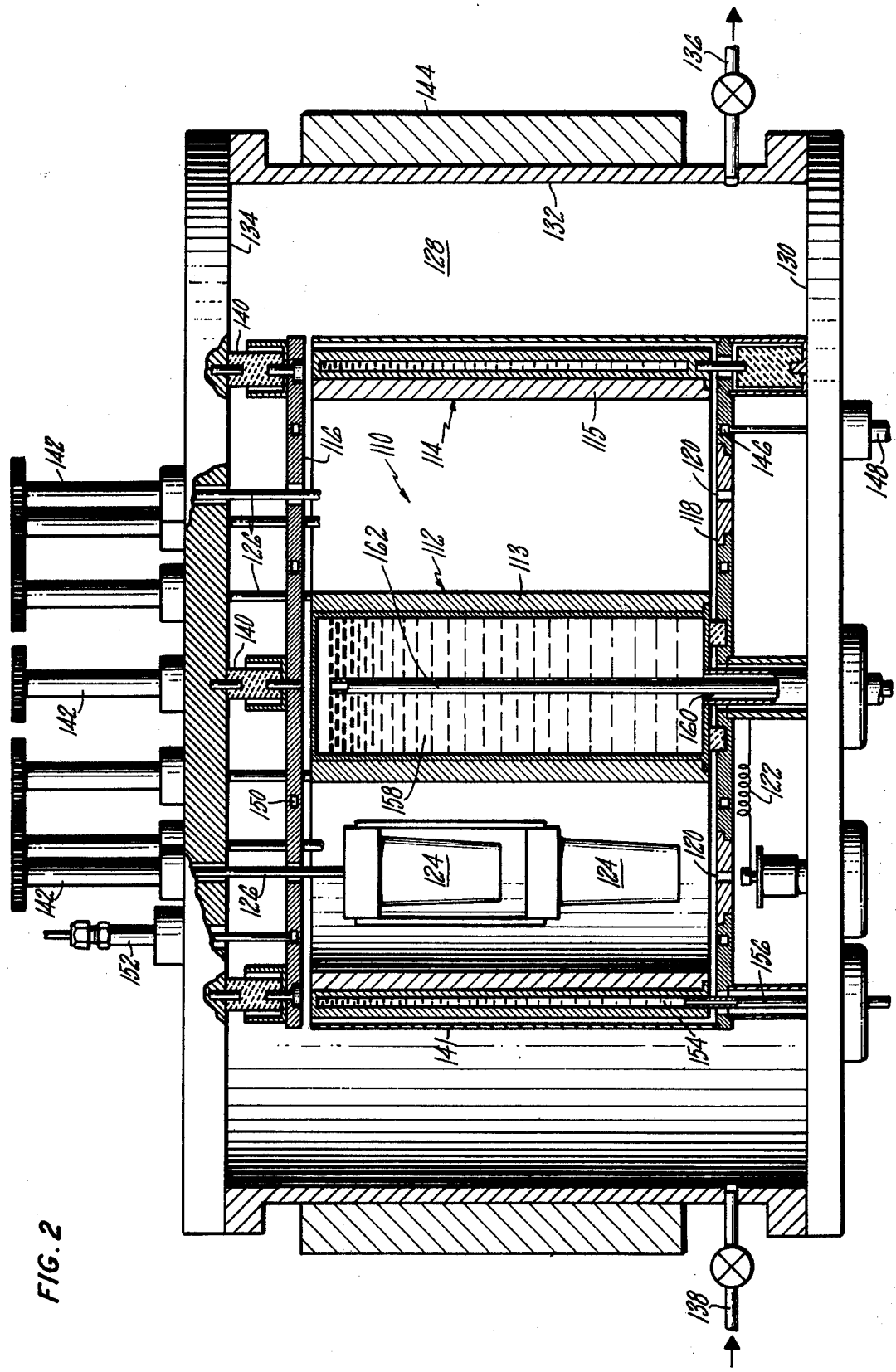
FIG. 2 is a more detailed cross section view of cathode sputtering apparatus embodying the concepts of the present invention.

The apparatus of the present invention is illustrated in expanded detail in FIG. 2. A sputtering chamber 110 is formed between a center, post cathode 112 and hollow, cylindrical cathode 114. The center, post cathode is formed of a can-like structure encased by a thick layer of sputtering material 113. The hollow, cylindrical cathode is formed of a cylindrical structure having a thick layer of sputtering material 115 on the inner surface thereof. An anode plate 116 is disposed at one end of the chamber 110 and a ground plate 118 having a plurality of apertures 120 is disposed at the opposing end of the chamber. A filament 122 of the type adapted for the thermionic emission of electrons is disposed beneath the ground plate. Substrate articles 124 are suspended within the sputtering chamber 110 on a rod-like member 126 which penetrates the anode plate 116. Alternatively, the filaments 122 may extend into the sputtering chamber.

The sputtering chamber 110 is encased within a vacuum chamber 128. The vacuum chamber is formed of a base plate 130, a cylindrical wall 132 and a detachable top plate 134. Discharge means 136 is adapted to evacuate the chamber and supply means 138 is adapted to flow working medium gases into the chamber. The anode plate 116 is suspended from a top plate 134 by a plurality of anode insulators 140. The insulators are fabricated of a ceramic material and electrically isolate the anode plate from the supporting top plate. The post cathode 112 and the hollow, cylindrical cathode 114 extend upwardly from the base plate 130 into the vacuum chamber 128 to form the sputtering chamber 110. Both the post cathode and the cylindrical cathode are electrically isolated from the base plate. A cylindrical ground shield 141 encases the hollow cathode to contain the plasma within the sputtering chamber. The substrate articles 124 are supported in the sputtering chamber on rod-like members 126 which extend through the top plate 134 and through the anode plate 116. The rods are rotatable within supports 142 in order to enable rotation of the substrate articles within the sputtering chamber. Additionally, although not specifically illustrated, the substrate articles may be caused to revolve about the center, post cathode. An electrical coil 144 is disposed about the outer periphery of the vacuum chamber wall 132. The energized electrical coil is adapted to impose a magnetic field within the sputtering chamber for further control of the plasma.

The major components of the apparatus which are in close proximity to the sputtering chamber 110 are cooled. The ground plate 118 has a plurality of passages 146 through which a cooling medium is flowable via the supply means 148. Similarly, the anode plate 116 has a plurality of passages 150 through which a cooling medium is flowable via the supply means 152. The hollow, cylindrical cathode 114 has passages 154 through which a cooling medium is flowable via the supply means 156. The post cathode 112 has a cooling reservoir 158 including supply means 160 and discharge means 162.

In a typical coating process employing the above described apparatus, the articles to be coated are first fixtured on the rotatable rods 126. The fixtured articles are lowered into the sputtering chamber and the chamber is evacuated. The chamber is then back filled with an inert gas such as argon. Argon may be continually flowed through the chamber, but a partial vacuum remains in the chamber. The filament 122 is next energized to emit electrons. The substrate is first biased positively to heat the substrate by electron bombardment to a preferred temperature, and then biased negatively to sputter clean the surface through argon ion bombardment. The sputter cleaned surface is ready for deposition of the coating material.

To deposit coating material the cathode is biased negatively and the anode is biased positively. Electrons migrating toward the positively charged anode strike argon atoms and cause the secondary emission of electrons therefrom. Positive argon ions are formed. The positive argon ions are drawn to the negatively charged cathodes. Impact of the ions on the surface of the cathode material causes sputtering of the cathode material into the chamber 110. The sputtered material impinges upon the substrate article and the coating develops. The substrate articles are rotated within the chamber to uniformly coat the substrate. Upon reaching the desired coating thickness, sputtering is terminated and the argon flow is stopped. The system is evacuated and allowed to cool. The coated parts are then removed.

The apparatus described is useful in applying both high temperature, metallic and ceramic coatings. One family of metallic coatings used widely within the aircraft industry for coating turbine blades and vanes comprises a base of chromium/aluminum/yttrium in combination with one of the following base metals: iron (FeCrAlY), cobalt (CoCrAlY) or nickel (NiCrAlY). Ceramic coatings of known utility include yttria ($Y_2O_3$), stabilized zirconia ($ZrO_2$), alumina ($Al_2O_3$), silicon carbide (SiC) and silicon nitride ($Si_3N_4$). Those skilled in the art will recognize that the above coatings are merely examples of useful coatings and do not comprise a comprehensive list of all sputterable coatings. In addition to single composition depositions, dual coatings or graded coatings may be applied with the apparatus disclosed.

The filament 122 is the source of electrons for ionization of the inert gas. An AC voltage within the range of 12 to 15 volts is sufficient to produce thermionic electron emissions from a tungsten filament. The filament may be disposed beneath a ground plate as illustrated or may be disposed within the sputtering chamber itself. The anode plate 116 is positively charged to a DC potential within the range of approximately 30 to 50 volts. A positive potential within the 30 to 50 volt range is generally sufficient to cause the electrons emitted by the filament 122 to be drawn through the sputtering cavity 110.

The post cathode 112 and the cylindrical cathode 114 are negatively charged to either a DC or RF potential. DC potentials within the range of 500 to 2000 volts and RF potentials within the range of 500 to 5000 volts are typical. DC or RF potentials may be used for metallic coatings. RF potentials are exclusively required for ceramic coatings to prevent the buildup of a positive charge on the surface of the cathodes.

Substrate bias has been found to be particularly useful in heating and cleaning the substrate both prior to and during deposition of the coating. A positive bias on the substrate article heats the substrate as a portion of electrons is drawn to the biased substrate in lieu of the anode. Heating of the substrate through electron bombardment results. A negative bias draws the argon ions to the substrate. The kinetic energy of the argon ions imparted at impact to surface impurities on the substrate cause the impurities to be sputtered away from the substrate. Sputter cleaning of the substrate results. Additionally, the application of a negative bias to the substrate during the coating process avoids the formation of open columnar structures.

As is viewable in FIG. 2, an electrical coil 144 is disposed about the outer wall 132 of the vacuum chamber. The coil when energized establishes a magnetic field within the chamber which shapes the argon ion plasma bombarding the cathode. The coating material is concentrated in a preferred region and locally increased coating depths are deposited.

Although the invention has been shown and described with respect to preferred embodiments thereof, it should be understood by those skilled in the art that various changes and omissions in the form and detail thereof may be made therein without departing from the spirit and the scope of the invention.

Having thus described typical embodiments of our invention, that which we claim as new and desire to secure by Letters Patent of the United States is:

1. Cathode sputtering apparatus for depositing a coating on an underlying substrate, comprising:
   a center, post cathode adapted to have a layer of coating material adhered to the outer surface thereof and having an internal reservoir through which a cooling medium is flowable during operation of the apparatus;
   a hollow, cylindrical cathode disposed concentrically about said post cathode forming an annular sputtering chamber therebetween, said cylindrical cathode adapted to have a layer of coating material adhered to the interior surface thereof and having internal passages through which a cooling medium is flowable during operation of the apparatus;
   an anode plate disposed at one end of said annular sputtering chamber;
   a cylindrical ground shield encasing said cylindrical cathode and spaced closely apart therefrom;
   a ground plate disposed at the end of said annular chamber opposing the anode plate end wherein said ground plate is in electrical communication with said ground shield and wherein said ground plate has a plurality of apertures therein;
   means for discharging electrons through the apertures in said ground plate and into the sputtering chamber;
   a cylindrical wall encasing said ground shield shell and spaced apart therefrom;
   a base plate closing one end of said cylindrical wall;
   a top plate closing the end of said cylindrical wall opposing said base plate to form a vacuum chamber completely enclosing the sputtering chamber;
   means affixing said anode plate to said top plate including an anode insulator for electrically isolating said anode plate from said ground plate;
   means affixed to said top plate for supporting a substrate article to be coated within said annular sputtering chamber wherein said anode plate, top plate, and substrate article are jointly detachable from the apparatus.

2. The invention according to claim 1 wherein said vacuum chamber has means affixed thereto for evacuating said chamber and means affixed thereto for flowing a working medium gas through said chamber during operation of the apparatus.

3. The invention according to claim 1 wherein said substrate support means are adapted to rotate the substrate articles within the sputtering chamber.

4. The invention according to claim 3 wherein said vacuum chamber wall has disposed in proximity thereto an electrical coil for generating a magnetic field within said sputtering chamber.

5. The invention according to claim 1 which further includes means for electrically biasing said substrate articles.

6. The invention according to claim 5 which further includes means for negatively biasing said substrate articles.

7. The invention according to claim 5 which further includes means for positively biasing said substrate articles.

8. The invention according to claim 7 wherein said vacuum chamber wall has disposed in proximity thereto an electrical coil for generating a magnetic field within said sputtering chamber.

9. The invention according to claim 1 wherein said vacuum chamber wall has disposed in proximity thereto an electrical coil for generating a magnetic field within said sputtering chamber.

* * * * *

UNITED STATES PATENT OFFICE
CERTIFICATE OF CORRECTION

PATENT NO. : 4,090,941

DATED : May 23, 1978

INVENTOR(S) : ROBERT JOSEPH WRIGHT ET AL

It is certified that error appears in the above-identified patent and that said Letters Patent are hereby corrected as shown below:

Claim 1, column 6, line 4: after "shield" delete "shell".

Signed and Sealed this

Third Day of October 1978

[SEAL]

Attest:

RUTH C. MASON
*Attesting Officer*

DONALD W. BANNER
*Commissioner of Patents and Trademarks*